United States Patent
Daily et al.

(10) Patent No.: US 7,291,036 B1
(45) Date of Patent: Nov. 6, 2007

(54) PHOTOVOLTAIC CONNECTION SYSTEM

(75) Inventors: Christopher G. Daily, Harrisburg, PA (US); Scott S. Duesterhoeft, Etters, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/557,799

(22) Filed: Nov. 8, 2006

(51) Int. Cl.
*H01R 13/00* (2006.01)

(52) U.S. Cl. ..................... 439/487; 439/76.1

(58) Field of Classification Search ............... 439/76.1, 439/485, 487
See application file for complete search history.

(56) References Cited

U.S. PATENT DOCUMENTS 4,460,232 A * 7/1984 Sotolongo ................. 439/535
6,614,659 B2 * 9/2003 Feigenbaum et al. ....... 361/719
6,848,933 B1 * 2/2005 Delaney et al. ............ 439/392
2003/0107874 A1 * 6/2003 Feigenbaum et al. ....... 361/704

OTHER PUBLICATIONS

Electronic Internet Catalog: SOLARLOK® Interconnection System, Global Industrial and Commercial, Catalog 889753-2, Revised 06-05, pp. 1-19.

* cited by examiner

Primary Examiner—James R. Harvey (57) ABSTRACT

A photovoltaic connection system for maximum current output and heat dissipation properties. The connection system includes a connection box with improved heat transfer capability to permit higher current output capacity. Diodes are surface-mounted on a printed circuit board inside of the connection box. An optional metal plate may be mounted inside the cover plate of the connection box as a heat sink for dissipating heat from the diodes. The metal in the plate has good thermal transfer characteristics, e.g., copper or aluminum.

20 Claims, 7 Drawing Sheets

PHOTOVOLTAIC CONNECTION SYSTEM

FIELD OF THE INVENTION

The present invention is directed to a connection system for photovoltaic arrays, and more particularly to a connection box in a PV connection system with improved thermal transfer properties for greater current carrying capacity.

BACKGROUND OF THE INVENTION

Photovoltaic (PV) modules or arrays produce electricity from solar energy. Electrical power produced by PV modules reduces the amount of energy required from non-renewable resources such as fossil fuels and nuclear energy. Significant environmental benefits are also realized from solar energy production, for example, reduction in air pollution from burning fossil fuels, reduction in water and land use from power generation plants, and reduction in the storage of waste byproducts. Solar energy produces no noise, and has few moving components. Because of their reliability, PV modules also reduce the cost of residential and commercial power to consumers.

PV cells are essentially large-area semiconductor diodes. Due to the photovoltaic effect, the energy of photons is converted into electrical power within a PV cell when the PV cell is irradiated by a light source such as sunlight. PV cells are typically interconnected into solar modules that have power ranges of up to 100 watts or greater. For large PV systems special PV modules are produced with typical power range of up to several 100 W. A photovoltaic module is the basic element of a photovoltaic power generation system. A PV module has many solar cells interconnected in series or parallel, according to the desired voltage and current parameters. PV cells are connected and placed between a polyvinyl plate on the bottom and a tempered glass on the top. PV cells are interconnected with thin contacts on the upper side of the semiconductor material. The typical crystalline modules power ranges from several W to up to 200 W/module.

In the case of facade or roof systems the photovoltaic system may be installed during construction, or added to the building after it is built. Roof systems are generally lower powered systems, e.g., 10 kW, to meet typical residential loads. Roof integrated photovoltaic systems may consist of different module types, such as crystalline and micro-perforated amorphous modules. Roof-integrated photovoltaic systems are integrated into the roof, such that the entire roof or a portion thereof is covered with photovoltaic modules, or they are added to the roof later. PV cells may be integrated with roof tiles or shingles.

PV modules/arrays require specially designed devices adapted for interconnecting the various PV modules/arrays with each other, and with electrical power distribution systems. PV connection systems are used to accommodate serial and parallel connection of PV arrays. In addition to connection boxes, a PV connection system includes connectors that allow for speedy field installation or high-speed manufacture of made-to-length cable assemblies. Connection or connection boxes may be required to receive specialized cable terminations from PV modules/arrays, with power diodes inside for controlling current flow to the load. Thus, certain connection box configurations may generate internal heat, which must be dissipated in order to protect the internal components and external structures adjacent to the connection box. In many cases, governmental regulations and industry standards establish the permissible temperature rise that must be maintained.

Therefore, there is a need for an improved connection box for dissipating heat expelled from electrical/electronic components inside of the box.

SUMMARY OF THE INVENTION

The present invention is directed to a junction box for interconnection of solar cell arrays in a power distribution system. The junction box includes a cover portion, a box portion and a printed circuit board (PCB). The cover portion includes a liner plate, mounting elements for mounting the PCB to the cover portion, and latch members for latching the cover portion to the box portion. The PCB has a first surface that includes diode elements. Each diode element has an associated heat sink element attached to the diode elements for dissipating heat generated by the diode elements. The second surface of the PCB has a plurality of foil elements and a plurality of clip elements. The box portion includes a hollow interior for receiving the PCB. A first opening receives the cover portion, and a second opening disposed opposite the first opening receives external power input wiring. A plurality of contact elements is disposed in the box portion for electrically connecting the PCB to the solar cell array. The box portion also includes receiving members to retentively engage the foil elements and recesses for retentively engaging the latch members. The heat sink elements are maintained in contact with the liner plate when the latch members are engaged with the recesses of the box portion, such that the heat sinks transfer heat to the liner plate, and the liner plate conducts heat to the cover portion for dissipation externally of the junction box.

An advantage of the present invention is improved current output capacity for PV junction boxes through novel heat dissipation techniques.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
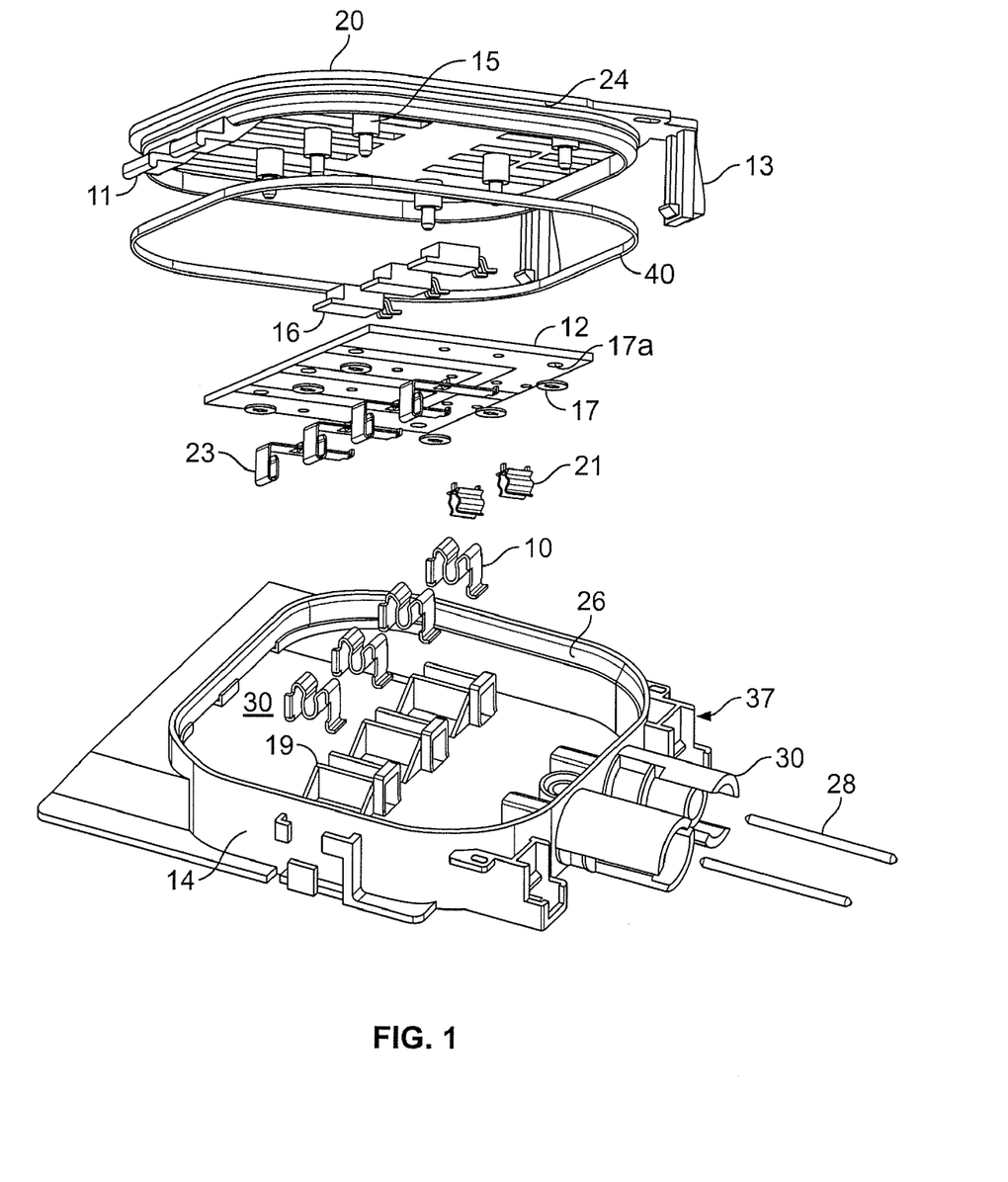
FIG. 1 is an exploded view of the junction box assembly of the present invention.

The present invention is directed to a junction box for interconnection of solar cell arrays. FIG. 1 is an exploded view of the present invention including the junction box 14, printed circuit board (PCB) 12 and the cover portion 20. Diodes 16 are part of the electric circuitry on the printed circuit board 12. The J-Box (14) includes spring clips 10 mounted on the interior of the box 14 that receive contact members 23 that are mounted on PCB 12. PCB 12 has push lock washers 17 that receive mounting posts 15, so that the PCB 12 rests and is secured on mounting posts 15. A separate cover portion 20 has latch members 13 that mate with a recess portion 37 on the box 14 to retain the cover portion 20 on the junction box 14. The cover portion 20 also includes arm portions 11 opposite the latch members 13, that slide beneath a flange 39 on the box 14 in cooperation with the latch members 13, maintain the cover portion 20 in position. A gasket 40 preferably is used to provide a weatherproof seal. The gasket 40 is compressed between a lip 24 on the cover portion and a ridge 26 of the box 14 when the cover portion 20 is latched into position on the box 14. A copper plate or lining 18 is adhesively or mechanically attached to the underside of the cover portion 20. The copper plate 18 enhances thermal conduction of the internal components contained in the junction box 14, as discussed in greater detail below.

The junction box 14 and associated cover portion 20 can be constructed of a substantially rigid, electrical insulating material suitable to receive the printed circuit board 12, such as an ABS plastic or other suitable material. The junction box/cover material preferably has good thermal conductivity. The power interface termination contacts 21, diodes 16 and other electrical components (not shown for simplicity of the drawing) are secured to the printed circuit board 12 with surface mount technology, solder connections, or any other suitable connection. The solder connection used can be a wave-solder connection or any other suitable solder connection. FIG. 1 shows a four-position junction box 14 for receiving the cover portion 20, and the PCB 12 which is mounted on the cover portion 20. PCB 12 includes mounted components—e.g., diodes 16, power interface contacts 21 and contact members 23—however, it is to be understood that a junction box 14 and PCB 12 having one or more positions can be used for the present invention. The PCB 12 is modified with the number of contact members 23 and diodes 16 mounted thereon, depending upon the number of positions on the junction box 14. For example, a junction box 14 with two positions would have a printed circuit board 12 with two contact members 23 mounted thereon. The printed circuit board 12 is coated with a sufficient amount, preferably a minimum of two ounces of copper or a copper alloy on both sides. However, any other type of conductive metal may be used. The system also includes the printed circuit board 12 having diodes 16 with integral heat sinks as part of the cathodes to help dissipate heat within the junction box.

The diode circuitry used with the present invention can be TO-220 packaged diodes 16. The TO-220 packaged diodes 16 contain heat sinks that assist with dissipating heat and help to meet the temperature standard of IEC 61215 (Ed. 2) or other applicable industry standards. The present invention may also use ITO-220 diodes that have plastic covered heat sinks and help to dissipate any generated heat to meet the temperature standard. In addition to the TO-220 diode and ITO-220 diode, any other similar and suitable diode that can meet the temperature standard may be used with the present invention.

Figure 2A:
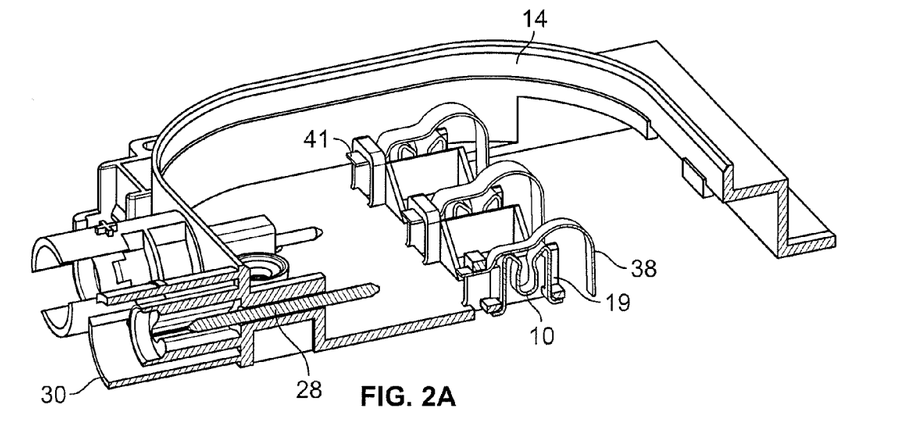
FIGS. 2A-2C show cross-sectional perspective views of the cover portion engaging the junction box.
Figure 2B:
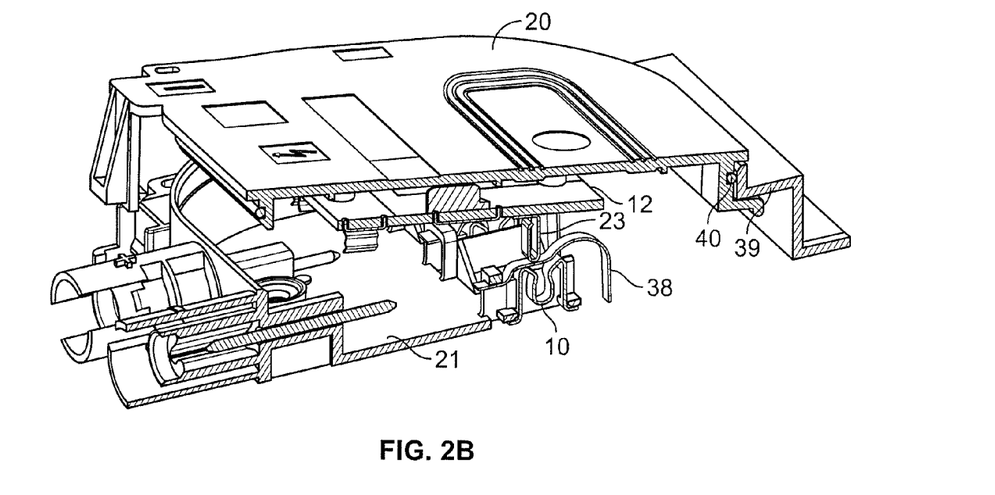
Figure 2C:
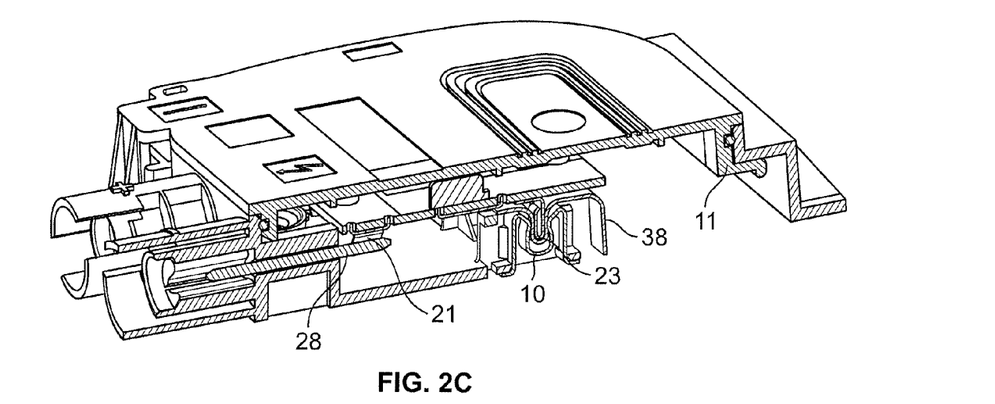

FIG. 1 also shows the posts 15 that secure the printed circuit board 12 to the cover portion 20 and latch members 13 that secure the cover portion 20 to the junction box 14 when closed. The printed circuit board 12 has apertures 17a and washers 17 that receive the cover portion 20 when lowered into place. As the printed circuit board 12 is lowered onto the cover portion 20, the posts 15 slide through the circuit board apertures 17a. The cover portion 20 is lowered onto the junction box 14 when terminating the foil strip 38 (see, e.g., FIGS. 2A-2C). The posts 15 are configured to securely prevent movement of the printed circuit board 12 once it is in place secured to cover portion 20. The latch members 13 are configured such that the cover portion 20 engages the junction box 14 with latch 13 as shown in FIGS. 2A-2C. The latch 13 can be released by hand, i.e., without the aid of a tool or utensil, to detach the cover portion 20 from the junction box 14, for convenience in installing and servicing a solar cell power distribution system. Alternately, the latch 13 can be designed such that the use of a tool or utensil is required for release to free the cover portion 20 from the junction box 14, thereby restricting access. With either design, the posts 15 (in addition to securing the cover portion 20 to the junction box 14) prevent the circuit board 12 from moving substantially in any direction when disposed and secured in the junction box 14. The posts 15 and latch members 13 may be constructed of the same material, such as ABS plastic or any other suitable material, as the junction box 14 and can be of unitary construction with the junction box 14 as well. In addition, a pair of fuse-style clips 21 attached to the PCB 12 clip onto mating posts 28 when the cover portion 20 is pressed into position on the junction box 14. The power interface contacts 21 retentively engage the mating posts 28 to provide electrical engagement between the PCB 12 and the junction box 14.

In addition to the posts 15 and latch members 13 that are disposed in the cover portion 20, the junction box 14 contains supports 19 that provide support for the printed circuit board 12 when the cover portion 20 is secured in place in the junction box 14 by latch members 13 and arms 11. The supports 19 may be constructed of the same material as the junction box 14, the posts 15 and latch members 13. The supports 19 can be of unitary construction with the junction box 14. The supports 19 provide a guide to contain the foil strips 38 between the contact elements 23 and the clips 10, and provides a stable foundation for the printed circuit board 12 to rest upon in the junction box 12 when secured in place on the posts 15.

As previously indicated, the junction box 14 has a pair of sockets 30 for receiving external power connectors of a solar cell array (not shown). The sockets 30 are hollow cylindrical conduits that encompass mating posts 28. The sockets may be configured for bayonet-type locking engagement, threaded engagement, or any other connections known in the art. Polarization features (not shown) may be incorporated into the sockets 30 to ensure proper polarity of the external connections with the PCB 12. The mating posts 28 are preferably provided in pairs for each box, although boxes may be configured with a singular mating post, three posts, or other arrangements, as required by the PCB 12. The mating posts 28 are electrical conductors for connecting the external power distribution (not shown) to the PCB 12. The mating posts 28 are insert molded or otherwise formed or pressed within the box 14, thereby maintaining the weatherproof seal inside of the box 14.

An aperture 34 (shown in FIG. 3) is provided in the bottom of the box 14, for receiving incoming power conductors (e.g., the flexible foil strip 38 shown in FIGS. 2A-2C) from the solar cell array (not shown). The bottom of the box 14 is typically installed against a flat surface, such as a rooftop-mounted array, which is sealed to the outside elements around the periphery of the box 14 and the aperture 34.

Referring to FIGS. 2A-2C, a partial cross-sectional perspective view shows sequentially the placement of the cover portion 20 over the junction box 14. FIG. 2A shows an open box 14. Flexible foil strips 38 are connected at one end to the external phovoltaic array (not shown). The other end of the is flexible foil strips 38 are retained in the box 14 by loop 41, and are positioned over the clip 10, to allow dressing of the foil strip 38 until the cover portion 20 is set in place. Mating posts 28 are molded into the box 14 between the socket 30 and the box 14 interior. Contact elements 23 push the foil strips 38 into the clips 10 when the cover portion 20 is placed over the box 14, as shown in FIGS. 2B and 2C. The contact elements 23 and the foil strips 38 apply an outward force on the clip 10. The clip 10 maintains the position of the contact elements 23 and the foil strips 38, while providing electrical contact therebetween, and prevents any lateral movement. As the cover portion 20 is lowered over the box 14, the foil strip 38 deforms under the contact element 23, wedging into the gap of the clip 10. The clip 10 is preferably metallic and conductive, and resilient so as to apply a retentive contact force to the contact element 23 and the foil strip 41. When the cover portion 20 is fully engaged on top of the box 14, each of the contact elements 23 is in electrical communication with the respective foil strip 38, as illustrated in FIG. 2C. Power interface contacts 21 retentively engage the mating posts 28.

Figure 1A:
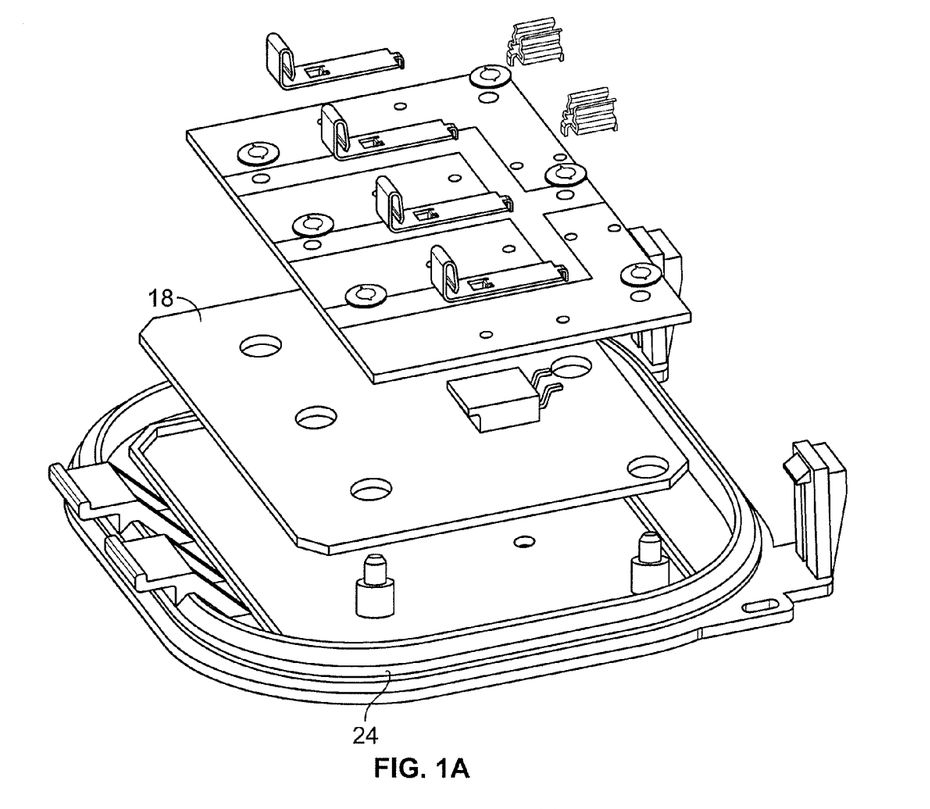
Figure 3:
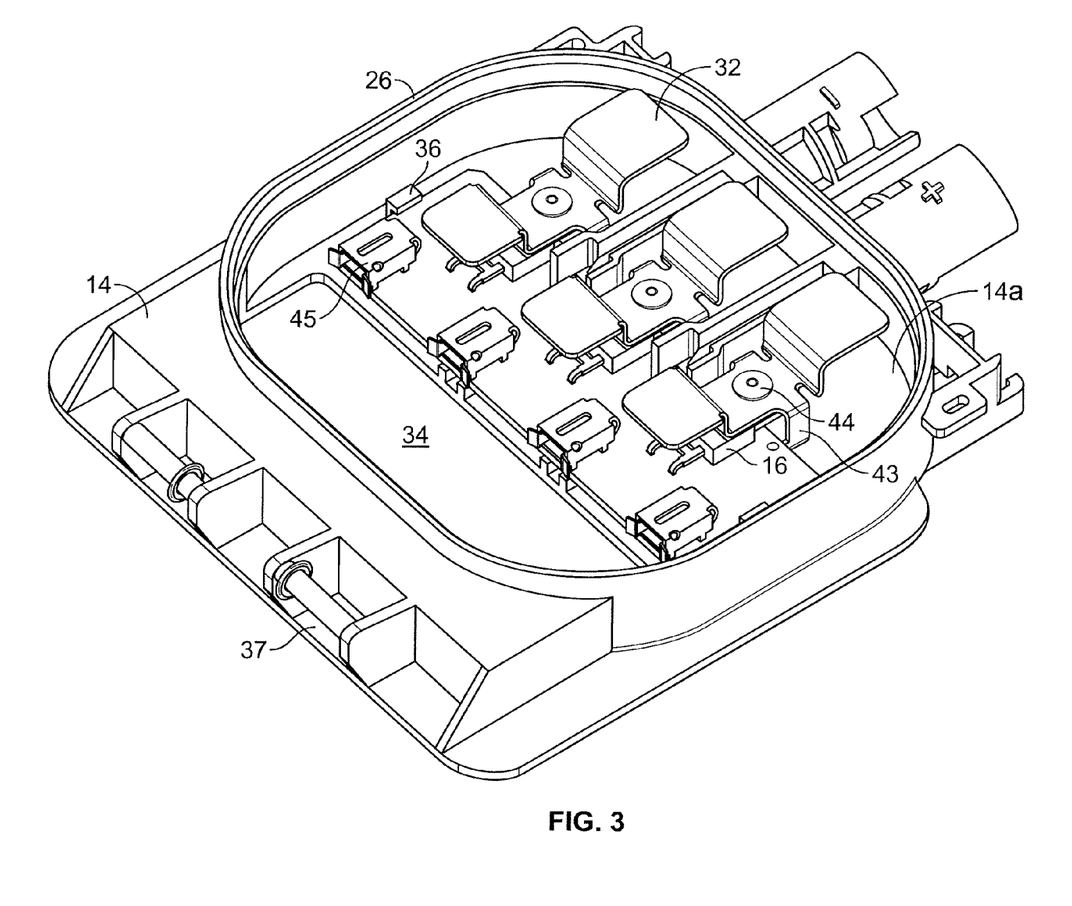
FIG. 3 shows the component mounting side of the PCB.

FIG. 3 shows an alternate embodiment of the junction box 14, with the opposite side of the PCB 12 facing upward. In the configuration shown, the PCB 12 is fastened into the bottom of the box 14, by sliding engagement with latch 36. There are four termination contacts 45 arranged across one edge of the PCB 12. The termination contacts 45 are preferably secured to the PCB 12 with a solderless connection, or alternately are soldered to the PCB 12. Diodes 16 are attached to the PCB 12 adjacent to the termination contacts 45, and are fastened to heat sinks 32 via rivets 44. The heat sinks 32 and diodes are in thermal communication. The heat sinks 32 may be constructed of copper, aluminum, or other thermally conductive material. The heat sinks 32 have roots 43 extending downwardly to engage the bottom of the PCB 12 for support. When the cover portion 20 is engaged with junction box 14, there is an air gap between the cover portion 20 and the heat sinks 32. Heat is conducted from the PCB components—including termination contacts 45 and diodes 16, and other electrical and electronic components through heat sinks 32. Cover portion 20 dissipates the heat from the interior of the junction box 14 to the external environment. By contrast, in the embodiments of FIGS. 1 and 1A, the diodes 16 are in thermal contact with the cover portion 20 or the liner plate 18, to dissipate heat directly to the cover portion 20.

The termination contacts 45 are preferably poke-in style contact assemblies that provide a secure connection for external wire tabbing from the PV array, and that do not require the use of tools or other utensils when inserting. The poke-in contact includes a lance (not shown) that displaces upon insertion of the wire tabbing The poke-in contact applies a force or retention when the tabbing is forced outward from the poke-in contact without the use of tools or other utensils. To effectively remove the tabbing from the contact, a tool or utensil is used to depress the lance and release the tabbing and the force applied to the tabbing by the lance.

Figure 4A:
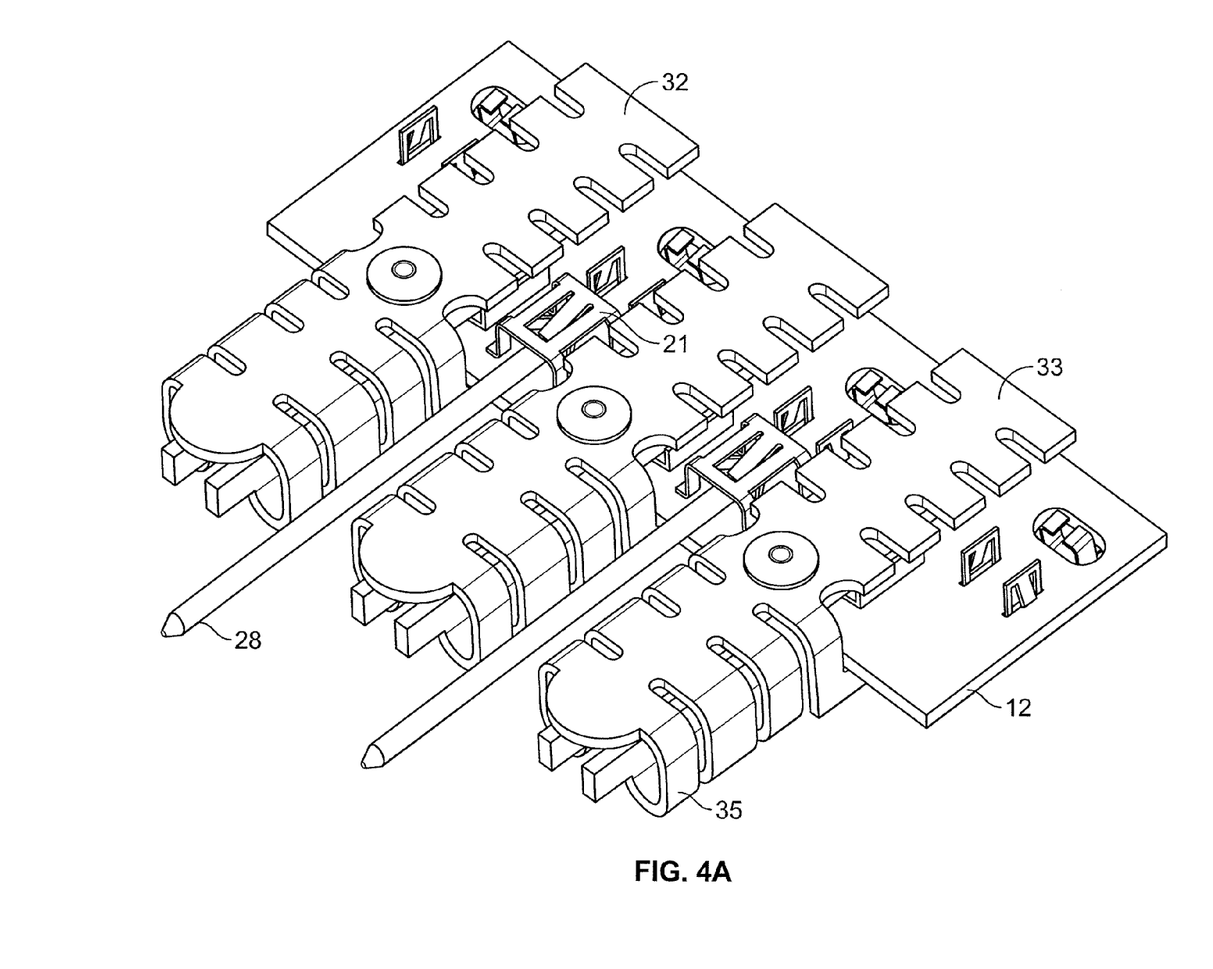
FIGS. 4A-4C are alternate embodiments of the PCB having a modified heat sink.
Figure 4B:
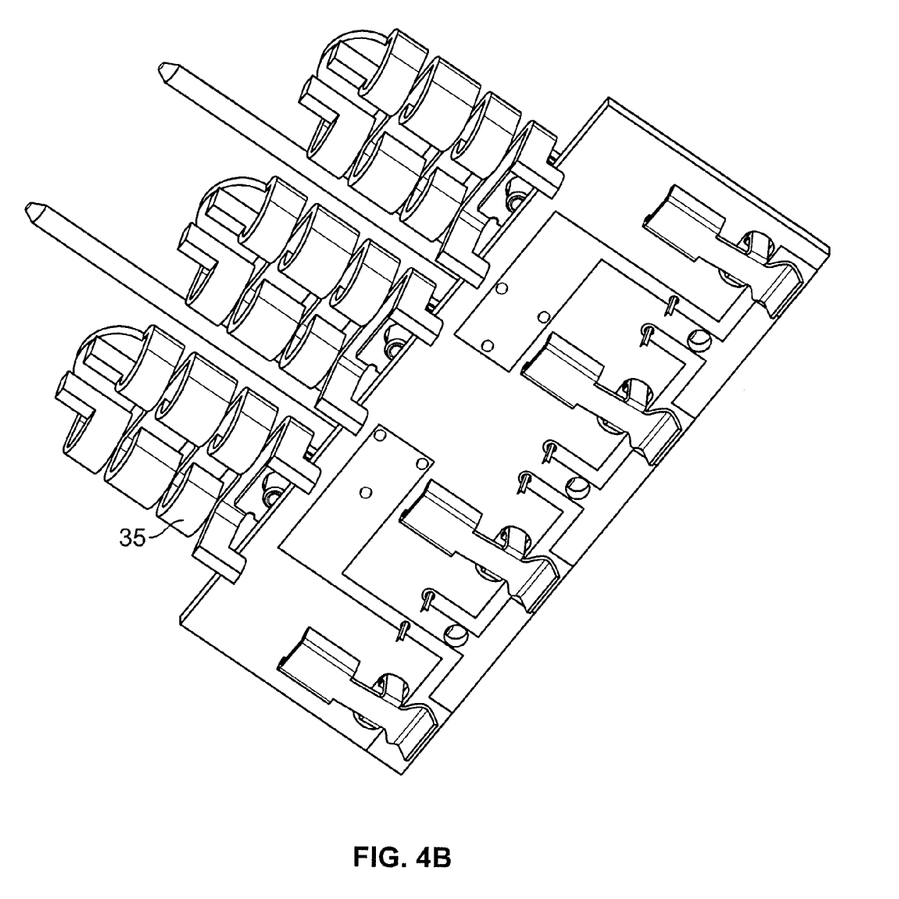
Figure 4C:
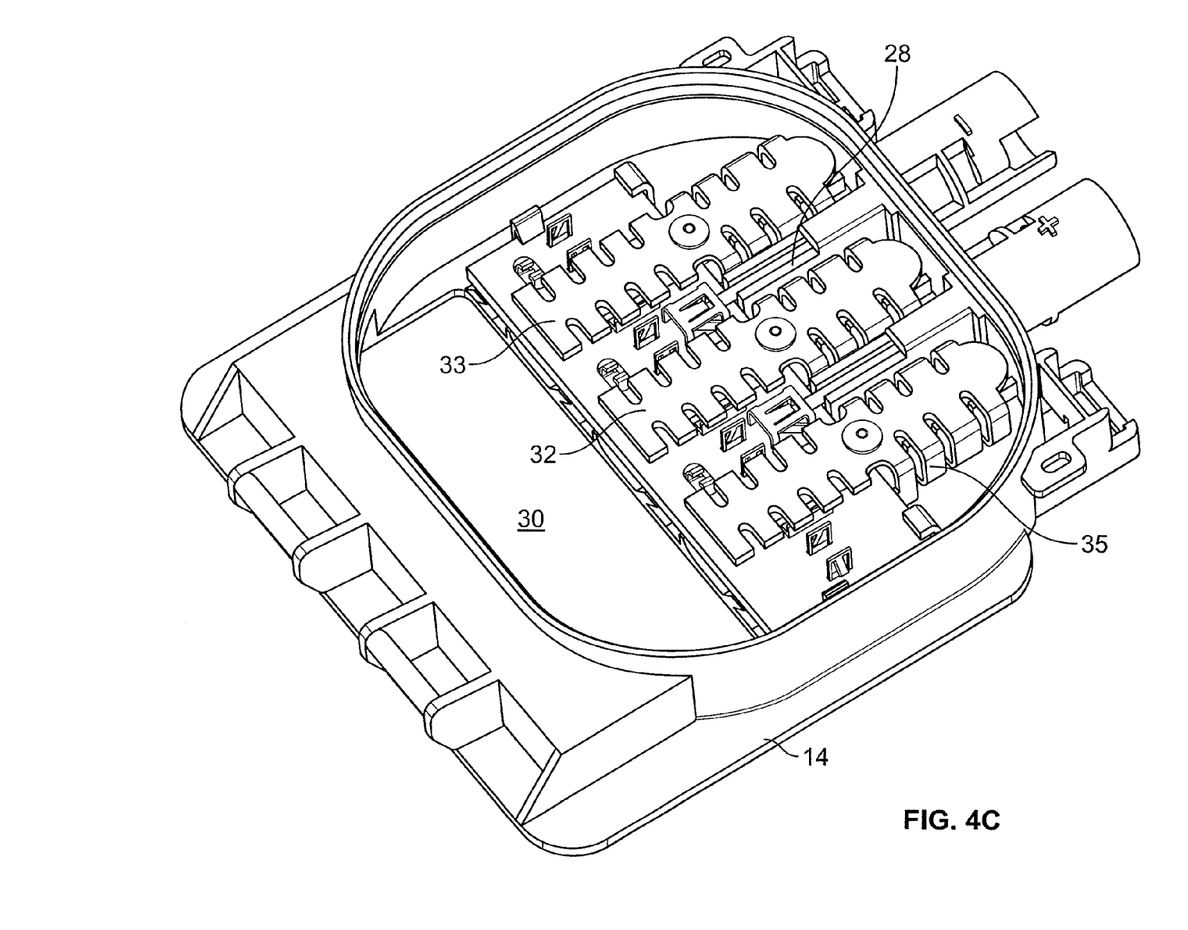

Referring next to FIGS. 4A, 4B and 4C, one embodiment of the present invention includes modified heat sinks 32 having radiant fins 33 in thermal contact with the PCB 12, the radiant fins 33 contact the PCB 12 and diodes 16. The heat sinks 32 also have helically-coiled fins 35 extending downwardly towards the bottom of the junction box 14. The helical fins 35 provide expanded heat transfer surface area for dissipating heat. FIG. 4C shows the PCB 12 mounted inside of the junction box 14 and adjacent to aperture 34, with the heat sinks 32 mounted thereon.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A junction box for interconnection of solar cell arrays in a power distribution system, the junction box comprising:
   a cover portion, a box portion and a printed circuit board (PCB);
   the cover portion including a thermally conductive liner plate attached to one side, and a plurality of latch members for latching the cover portion to the box portion;
   the PCB having first and second surfaces, the first surface having a plurality of diode elements, each diode element having a heat sink element attached thereto for dissipating heat generated by the diode elements; and the second surface having a plurality of foil elements and a plurality of clip elements; and
   the box portion having:
   a hollow interior for receiving the PCB,
   a first opening for receiving the cover portion,
   a second opening disposed opposite the first opening for receiving external power input wiring; a plurality of contact elements disposed in the box portion for electrically connecting the PCB to the solar cell array,
   receiving members for receiving the foil elements, and recesses for engaging the plurality of latch members;
   wherein the heat sink elements being maintained in contact with the liner plate when the latch members are engaged with the recesses of the box portion, such that the heat sinks transfer heat to the liner plate, and the liner plate conducts heat to the cover portion for dissipation externally of the junction box.

2. The junction box of claim 1, wherein the foil elements retentively engage the receiving members to properly align the cover portion with the box portion.

3. The junction box of claim 1, wherein the clip elements retentively engage the contact elements for alignment and for dissipating heat from the contact element.

4. The junction box of claim 1, wherein the box portion and the cover portion being constructed of a substantially rigid, electrical insulating and thermally conductive material.

5. The junction box of claim 1, wherein the PCB also includes a plurality of termination contacts for retentively receiving a plurality of external wire conductors.

6. The junction box of claim 1, wherein the spring clips being secured to the printed circuit board with a solderless connection to receive the external power input wiring.

7. The junction box of claim 1, wherein the spring clips being secured to the printed circuit board with a soldered connection to receive the external power input wiring.

8. The junction box of claim 1, wherein the box portion having four positions.

9. The junction box of claim 1, wherein the box portion having at least one position.

10. The junction box of claim 1, wherein at least one diode element of the plurality of diode elements being TO-220 packaged diodes, wherein the TO-220 packaged diodes having heat sink tabs for dissipating heat.

11. The junction box of claim 1, wherein at least one diode element of the plurality of diode elements being ITO-220 diodes, wherein the ITO-220 diodes having plastic covered heat sinks to dissipate heat at a rate sufficient to meet the requirements of IEC 61215.

12. The junction box of claim 1, wherein the latch members are manipulable to release the cover portion from the box portion.

13. The junction box of claim 1, wherein the latch members being configured such that a tool is required for releasing the cover portion from the box portion.

14. The junction box of claim 12, wherein the posts and latch members prevent the PCB from moving substantially in any direction when the PCB is securely disposed within the box portion.

15. The junction box of claim 1, further comprising a plurality of securing devices, the securing devices being configured to substantially secure the printed circuit board in place.

16. A junction box for interconnection of solar cell arrays in a power distribution system, the junction box comprising:
a cover portion, a box portion and a printed circuit board (PCB);
the cover portion including a plurality of latch members for latching the cover portion to the box portion;
the PCB having first and second surfaces, the first surface having a plurality of diode elements, each diode element having a heat sink element attached thereto for dissipating heat generated by the diode elements; and
the second surface having a plurality of foil elements and a plurality of clip elements; and
the box portion having:
a hollow interior for receiving the PCB,
a first opening for receiving the cover portion,
a second opening disposed opposite the first opening for receiving external power input wiring; a plurality of contact elements disposed in the box portion for electrically connecting the PCB to the solar cell array,
receiving members for receiving the foil elements, and
recesses for engaging the plurality of latch members;
wherein the heat sink elements are spaced apart from the cover portion when the latch members are engaged with the recesses of the box portion, such that the heat sink elements transfer heat to the cover portion across an air gap inside of the box portion, and the cover portion conducts heat from the interior of the box portion for dissipation externally of the junction box.

17. The junction box of claim 16, wherein at least one of the heat sink elements includes fins for radiating heat.

18. The junction box of claim 17, wherein the at least some of the fins are helically coiled.

19. The junction box of claim 16, wherein the cover portion includes a thermally conductive liner plate attached to a side of the cover portion to conducts heat through an opposite side of the cover portion to dissipate heat externally of the junction box.

20. The junction box of claim 19, wherein the liner plate is comprised of copper.

* * * * *